(12) United States Patent
Yamazaki

(10) Patent No.: US 6,962,837 B2
(45) Date of Patent: *Nov. 8, 2005

(54) METHOD OF MANUFACTURING A SEMICONDUCTOR FILM AND METHOD OF MANUFACTURING A SEMICONDUCTOR DEVICE

(75) Inventor: Shunpei Yamazaki, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/115,915

(22) Filed: Apr. 5, 2002

(65) Prior Publication Data

US 2002/0106861 A1 Aug. 8, 2002

Related U.S. Application Data

(62) Division of application No. 09/114,075, filed on Jul. 13, 1998, now Pat. No. 6,399,454.

(30) Foreign Application Priority Data

Jul. 14, 1997 (JP) .............................................. 9-205346

(51) Int. Cl.⁷ ......................... H01L 21/00; H01L 21/84
(52) U.S. Cl. ...................................... 438/149; 438/479
(58) Field of Search ................................ 438/143, 149, 438/479, 486, 471

(56) References Cited

U.S. PATENT DOCUMENTS

| | | | |
|---|---|---|---|
| 4,561,171 A | 12/1985 | Schlosser | |
| 4,692,345 A | 9/1987 | Nishiura et al. | |
| 4,994,399 A | 2/1991 | Aoki | |
| 5,085,711 A | 2/1992 | Iwamoto et al. | |
| 5,147,826 A | 9/1992 | Liu et al. | |

(Continued)

FOREIGN PATENT DOCUMENTS

| | | | |
|---|---|---|---|
| EP | 0 556 795 | | 8/1993 |
| EP | 0 604 234 | | 6/1994 |
| JP | 60-119733 | | 6/1985 |
| JP | 63-168021 | | 7/1988 |
| JP | 03-229415 | | 10/1991 |
| JP | 05-299349 | | 11/1993 |
| JP | 06-196490 | | 7/1994 |
| JP | 06-267849 | | 9/1994 |
| JP | 06-268212 | | 9/1994 |
| JP | 06-333824 | | 12/1994 |
| JP | 06-333825 | | 12/1994 |
| JP | 8-213314 A | * | 5/1996 |
| JP | 8-130316 A | * | 8/1996 |
| JP | 09-115831 | | 5/1997 |
| JP | 2000-299285 | | 10/2000 |
| JP | 2003-178980 | | 6/2003 |
| JP | 2003-282435 | | 10/2003 |

OTHER PUBLICATIONS

Gang Liu and S.J. Fonash, "Selective area crystallization of amorphous silicon films by low–temperature rapid thermal annealing", Appl. Phys. Lett. 55 (7), Aug. 14, 1999, pp. 660–662.

(Continued)

Primary Examiner—George Fourson
Assistant Examiner—Fernando L. Toledo
(74) Attorney, Agent, or Firm—Eric J. Robinson; Robinson Intellectual Property Law Office, P.C.

(57) ABSTRACT

In a method of manufacturing a semiconductor film, nickel elements are first held as indicated by 103 on the surface of an amorphous silicon film 102. Then a crystalline silicon film 104 is obtained by a heat treatment. At this time, the crystallization is remarkably improved by the action of the nickel elements. During this crystallization, nickel elements are diffused in a film. Then a thermal oxide film 105 is formed as a barrier film, and a silicon film 106 containing a high concentration of phosphorus is formed. By carrying out a heat treatment, the nickel elements in the crystalline silicon film 104 are transferred into the silicon film 106. In this way, the concentration of nickel in the crystalline silicon film 104 is lowered.

35 Claims, 6 Drawing Sheets

U.S. PATENT DOCUMENTS

| | | |
|---|---|---|
| 5,229,306 A | 7/1993 | Lindberg et al. |
| 5,244,819 A | 9/1993 | Yue |
| 5,275,851 A | 1/1994 | Fonash et al. |
| 5,327,007 A | 7/1994 | Imura et al. |
| 5,380,372 A | 1/1995 | Campe et al. |
| 5,403,772 A | 4/1995 | Zhang et al. |
| 5,426,061 A | 6/1995 | Sopori |
| 5,426,064 A | 6/1995 | Zhang et al. |
| 5,441,899 A | 8/1995 | Nakai et al. |
| 5,444,001 A | 8/1995 | Tokuyama |
| 5,481,121 A | 1/1996 | Zhang et al. |
| 5,488,000 A | 1/1996 | Zhang et al. |
| 5,492,843 A | 2/1996 | Adachi et al. |
| 5,501,989 A | 3/1996 | Takayama et al. |
| 5,508,533 A | 4/1996 | Takemura |
| 5,529,937 A | 6/1996 | Zhang et al. |
| 5,534,716 A | 7/1996 | Takemura |
| 5,543,352 A | 8/1996 | Ohtani et al. |
| 5,563,426 A | 10/1996 | Zhang et al. |
| 5,569,610 A | 10/1996 | Zhang et al. |
| 5,569,936 A | 10/1996 | Zhang et al. |
| 5,580,792 A | 12/1996 | Zhang et al. |
| 5,585,291 A | 12/1996 | Ohtani et al. |
| 5,589,694 A | 12/1996 | Takayama et al. |
| 5,595,923 A | 1/1997 | Zhang et al. |
| 5,595,944 A | 1/1997 | Zhang et al. |
| 5,597,747 A | 1/1997 | Chen |
| 5,604,360 A | 2/1997 | Zhang et al. |
| 5,605,846 A | 2/1997 | Ohtani et al. |
| 5,605,847 A | 2/1997 | Zhang |
| 5,606,179 A | 2/1997 | Yamazaki et al. |
| 5,608,232 A | 3/1997 | Yamazaki et al. |
| 5,612,250 A | 3/1997 | Ohtani et al. |
| 5,614,426 A | 3/1997 | Funada et al. |
| 5,614,733 A | 3/1997 | Zhang et al. |
| 5,616,506 A | 4/1997 | Takemura |
| 5,616,507 A | 4/1997 | Nakai et al. |
| 5,620,910 A | 4/1997 | Teramoto |
| 5,621,224 A | 4/1997 | Yamazaki et al. |
| 5,624,851 A | 4/1997 | Takayama et al. |
| 5,637,515 A | 6/1997 | Takemura |
| 5,639,698 A | 6/1997 | Yamazaki et al. |
| 5,643,826 A | 7/1997 | Ohtani et al. |
| 5,646,424 A | 7/1997 | Zhang et al. |
| 5,654,203 A | 8/1997 | Ohtani et al. |
| 5,656,825 A | 8/1997 | Kusumoto et al. |
| 5,663,077 A | 9/1997 | Adachi et al. |
| 5,677,549 A | 10/1997 | Takayama et al. |
| 5,696,001 A | 12/1997 | Habenstein |
| 5,696,011 A | 12/1997 | Yamazaki et al. |
| 5,696,386 A | 12/1997 | Yamazaki |
| 5,696,388 A | 12/1997 | Funada et al. |
| 5,700,333 A | 12/1997 | Yamazaki et al. |
| 5,705,829 A | 1/1998 | Miyanaga et al. |
| 5,712,191 A | 1/1998 | Nakajima et al. |
| 5,736,420 A | 4/1998 | Min et al. |
| 5,789,284 A | 8/1998 | Yamazaki et al. |
| 5,796,116 A | 8/1998 | Nakata et al. |
| 5,828,429 A | 10/1998 | Takemura |
| 5,830,784 A | 11/1998 | Zhang et al. |
| 5,843,225 A | 12/1998 | Takayama et al. |
| 5,877,083 A * | 3/1999 | Yamazaki .................. 438/635 |
| 5,893,730 A | 4/1999 | Yamazaki et al. |
| 5,895,935 A | 4/1999 | Yamazaki et al. |
| 5,897,347 A | 4/1999 | Yamazaki et al. |
| 5,899,709 A | 5/1999 | Yamazaki et al. |
| 5,915,174 A | 6/1999 | Yamazaki et al. |
| 5,961,743 A | 10/1999 | Yamazaki et al. |
| 5,962,871 A | 10/1999 | Zhang et al. |
| 5,977,559 A | 11/1999 | Zhang et al. |
| 5,998,841 A | 12/1999 | Suzawa |
| 6,013,544 A | 1/2000 | Makita et al. |
| 6,048,758 A * | 4/2000 | Yamazaki et al. .......... 438/166 |
| 6,071,766 A | 6/2000 | Yamazaki et al. |
| 6,077,731 A | 6/2000 | Yamazaki et al. |
| 6,133,073 A | 10/2000 | Yamazaki et al. |
| 6,156,628 A | 12/2000 | Ohnuma et al. |
| 6,197,624 B1 | 3/2001 | Yamazaki |
| 6,218,219 B1 | 4/2001 | Yamazaki et al. |
| 6,235,563 B1 * | 5/2001 | Oka et al. .................. 438/166 |
| 6,242,290 B1 | 6/2001 | Nakajima et al. |
| 6,246,070 B1 | 6/2001 | Yamazaki et al. |
| 6,251,712 B1 | 6/2001 | Tanaka et al. |
| 6,281,552 B1 | 8/2001 | Kawasaki et al. |
| 6,326,642 B1 | 12/2001 | Yamazaki et al. |
| 6,331,457 B1 | 12/2001 | Yamazaki et al. |
| 6,348,368 B1 | 2/2002 | Yamazaki et al. |
| 6,359,320 B1 | 3/2002 | Yamazaki et al. |
| 6,380,046 B1 | 4/2002 | Yamazaki |
| 6,383,852 B2 | 5/2002 | Zhang et al. |
| 6,399,454 B1 * | 6/2002 | Yamazaki .................. 438/308 |
| 6,424,012 B1 | 7/2002 | Kawasaki et al. |
| 6,455,401 B1 | 9/2002 | Zhang et al. |
| 6,475,840 B1 | 11/2002 | Miyanaga et al. |
| 6,489,189 B2 | 12/2002 | Yamazaki et al. |
| RE38,266 E | 10/2003 | Yamazaki et al. |
| 6,784,455 B2 | 8/2004 | Maekawa et al. |
| 2001/0041397 A1 | 11/2001 | Fukushima |
| 2002/0013114 A1 | 1/2002 | Ohtani et al. |
| 2002/0134981 A1 | 9/2002 | Nakamura et al. |
| 2003/0036225 A1 | 2/2003 | Nakajima et al. |
| 2003/0089690 A1 | 5/2003 | Yamazaki et al. |
| 2003/0092225 A1 | 5/2003 | Yamazaki et al. |

OTHER PUBLICATIONS

Gang Liu and Stephen J. Fonash, "Polycrystalline silicon thin film transistors on Corning 7059 glass substrates using short time, low–temperature processing", Appl. Phys. Lett. 62 (20), May 71, 1993, pp. 2554–2556.

R. Kakkad, J. Smith, W.S. Lau, and S.J. Fonash, "Crystallized Si films by low–temperature rapid thermal annealing of amorphous silicon", J. Appl. Phys. 65 (5), Mar. 1, 1989, pp. 2069–2072.

C. Hayzelden, J.L. Batstone, R.C. Cammarata, "In situ transmission electron microscopy studies of silicide–mediated crystallization of amorphous silicon", Appl. Phys. Lett. 60 (2), Jan. 13, 1992, pp. 225–227..

A.V. Dvurechenskii et al., "Transport Phenomena in Amorphous Silican Doped by Ion Implantation of 3d Metals", Phys. Stat. Sol. (a) 95, 635, Jan. 1, 1986, pp. 635–640.

R. Kakkad, G. Liu, and S.J. Fonash, "Low Temperature Selective Crystallization of Amorphous Silicon", Journal of Non–Crystalline Solids, 115, Aug. 1, 1989, pp. 66–68.

F. Edelman et al., Structure and Transport Properties of Microcrystalline SiGe Films, pp. 232–235, (IEEE).

T. Hempel and O. Schoenfeld, "Needle–Like Crystallization of Ni Doped Amorphous Silicon Thin Films", Solid State Communications, vol. 85, No. 11, pp. 921–924, Mar. 1, 1993.

Official Filing Receipt, Specification, Claims, Abstract of U.S. Appl. No. 10/706,986, filed Nov. 14, 2003.

Official Filing Receipt, Specification, Claims, Abstract of U.S Appl. No. 10/678,139, filed Oct. 6, 2003.

* cited by examiner

METHOD OF MANUFACTURING A SEMICONDUCTOR FILM AND METHOD OF MANUFACTURING A SEMICONDUCTOR DEVICE

This application is a divisional of Ser. No. 09/114,075 filed Jul. 13, 1998 now U.S. Pat. No. 6,399,454.

BACKGROUND OF THE INVENTION

1. Field of the Invention

The present invention relates to a method of manufacturing a crystalline silicon film and a method of manufacturing a semiconductor device using the crystalline silicon film.

2. Description of the Related Art

A thin film transistor (hereinafter referred to as a TFT) using a silicon film formed on an insulating surface has been known.

As a structure of a thin film transistor presently put into practical use, there are a one using an amorphous silicon film and a one using a crystalline silicon film named high temperature polysilicon.

Since the one using the amorphous silicon film can use a glass substrate, it has been extensively used for an active matrix type liquid crystal display device.

However, since a TFT using an amorphous silicon film has low electrical characteristics, it does not have especially a field of application except being used for an active matrix circuit.

On the other hand, for the purpose of incorporating a driving circuit in a liquid crystal panel or obtaining a higher display function, it is required to obtain a TFT having higher characteristics. In addition, for the purpose of widening the range of application in addition to the active matrix, a TFT having characteristics higher than a TFT using an amorphous silicon film is required.

A high temperature p-Si is obtained by using a technique for obtaining a crystalline silicon film, which uses a heat treatment at a high temperature such as 900° C. or more.

In view of the requirements for high characteristics, it is preferable to use a crystalline silicon film. However, there is a problem that a glass substrate can not be used as a substrate at a temperature of heat treatment required for manufacturing the high temperature p-Si.

A thin film transistor is mainly used for an LCD device, and it is required that a glass substrate can be used as a substrate.

In addition, for the purpose of reducing a process margin and manufacturing cost, it is required to lower a process temperature.

As a means for solving the problem, a technique for obtaining a crystalline silicon film at a lower process temperature has been researched.

This process is called a low temperature process correspondingly to a process (high temperature process) for manufacturing the high temperature polysilicon.

A crystalline silicon film manufactured through this low temperature process is called a low temperature polysilicon.

Techniques for manufacturing low temperature polysilicon films are roughly divided into a method of using laser irradiation and a method of heating.

In the method of using laser irradiation, since laser light is directly absorbed in the vicinity of the surface of an amorphous silicon film, the surface of the amorphous silicon film is merely heated instantaneously and the entire surface is not heated. Thus, the irradiation of laser light can be made a step substantially not accompanied with heating.

However, this method has a problem in the stability of a laser oscillator, and a problem in application to a wide area. Moreover, the crystallinity of an obtained crystalline silicon film is not sufficient.

On the other hand, in the present circumstances, a required crystalline silicon film can not be obtained by a heat treatment at a temperature against which a glass substrate can withstand.

As a technique for improving these current problems, there is a technique disclosed in Japanese Patent Unexamined Publication No. Hei. 6-268212 by the same assignee as the present application.

According to this technique, a metallic element, typified by nickel, for promoting crystallization of silicon is held on the surface of an amorphous silicon film, and then a heat treatment is carried out, so that a crystalline silicon film having required crystallinity may be obtained at a temperatures lower than before at a temperature against which a glass substrate can withstand.

This crystallizing technique using nickel is useful since a crystalline silicon film having required crystallinity can be obtained by a heat treatment at such a low temperature that a glass substrate can withstand.

However, it is impossible to prevent nickel used for crystallization from remaining in an active layer, which causes instability of characteristics and lowering of reliability of a TFT.

SUMMARY OF THE INVENTION

An object of the present invention is, in the above-described technique of obtaining a crystalline silicon film by using a metallic element for promoting crystallization of silicon, to provide a structure for eliminating an influence of a nickel element remaining in an obtained silicon film.

According to the present invention, a method of manufacturing a semiconductor film is characterized by comprising the steps of:

forming a silicon film crystallized by an action of a metallic element for promoting crystallization of silicon; forming a barrier film on at least a part of the surface of the silicon film; forming a silicon film containing an element in group 15 on the barrier film; transferring the metallic element from the crystallized silicon film to the silicon film containing the element in group 15 by carrying out a heat treatment; and removing the silicon film containing the element in group 15.

In the above-mentioned present invention, as the metallic element for promoting crystallization of silicon, a kind of or plural kinds of elements selected from Fe, Co, Ni, Ru, Rh, Pd, Os, Ir, Pt, Cu, Au, Ge, Pb, and In may be used.

However, it is especially preferable to use nickel as the metallic element for promoting crystallization of silicon. In the case where nickel is used, the present invention disclosed in the present specification can be most remarkably obtained.

As the barrier film, a film selected from an oxide film, a nitride film, and a silicon nitride oxide film may be used. A natural oxide film, a thermal oxide film, a silicon oxide film formed by a plasma CVD method, or the like may be used as the oxide film.

This barrier film is used as an etching stopper at subsequent etching of the silicon film. Thus, it is important that the barrier film has the function of the etching stopper.

As the element in group 15, an element selected from P, As, and Sb may be used.

Especially, it is most preferable to use P (phosphorus) as an element in group 15. The present invention disclosed in the present specification can especially have a remarkable effect in the case where nickel is used as a metallic element for promoting crystallization and phosphorus is used as an element in group 15.

Moreover, it is important that the heat treatment for transferring the metallic element is carried out at a temperature selected from the range of 450° C. to 750° C.

By using the foregoing semiconductor film, a thin film transistor and a semiconductor device using the thin film transistor can be manufactured.

DETAILED DESCRIPTION OF THE PREFERRED EMBODIMENTS

First, the gist of the present invention will be described in brief with reference to FIGS. 1A to 1E showing concrete manufacturing steps.

Figure 1A:
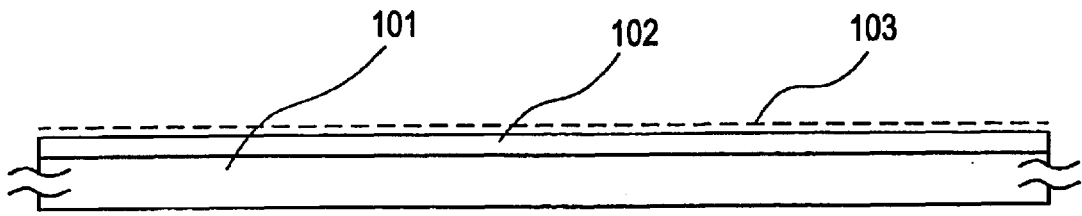
FIGS. 1A to 1F are views showing steps of obtaining a crystalline silicon film.

First, nickel as a metallic element for promoting crystallization of silicon is held as indicated by 103 on the surface of an amorphous silicon film 102 (FIG. 1A).

Figure 1B:
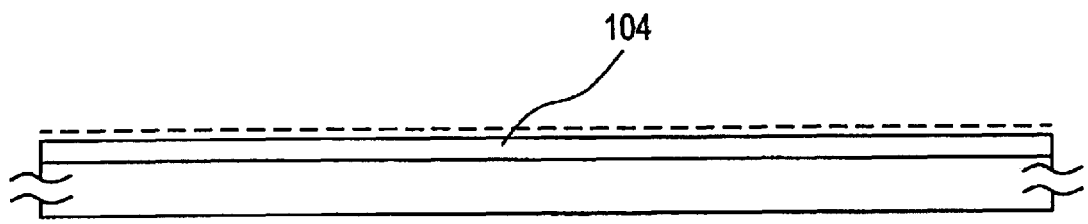

A heat treatment is carried out to crystallize the amorphous silicon film so that a crystalline silicon film 104 is obtained. At this time, nickel elements are diffused into the silicon film 104 (FIG. 1B).

Figure 1C:
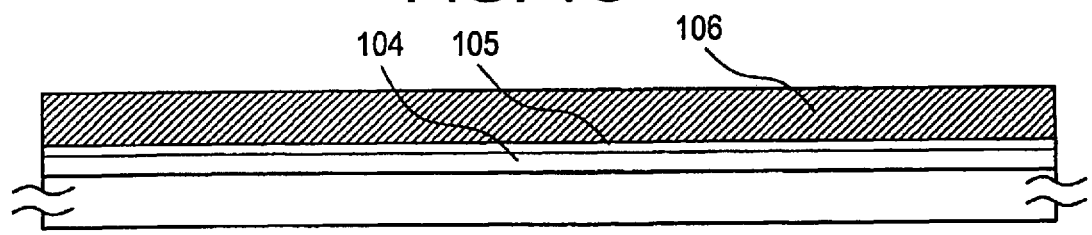

A thermal oxide film 105 is formed, and further, an amorphous silicon film 106 containing a high concentration of phosphorus is formed (FIG. 1C).

Next, a heat treatment is carried out to transfer the nickel elements existing in the silicon film 104 into the silicon film 106 containing phosphorus.

Then the silicon film 106 having drawn up the nickel elements is removed by using the thermal oxide film 105 as an etching stopper.

In this way, it is possible to obtain the silicon film 104 in which higher crystallinity is obtained by the action of the nickel element and the concentration of the nickel element is lowered.

Preferred embodiments of the present invention will next be described in more detail.

Embodiment 1

FIGS. 1A to 1E show the manufacturing steps of this embodiment. In this embodiment, a crystalline silicon film is formed on a glass substrate.

First, an amorphous silicon film 102 with a thickness of 50 nm is formed on a glass substrate 101 by a low pressure CVD method.

In this embodiment, a Corning 1737 glass substrate (distortion point 667° C.) is used as the glass substrate 101. In general, the distortion point can be a standard for a heat-resistance temperature of a glass substrate.

A plasma CVD method may be used as a film forming method of an amorphous silicon film. However, in view of a problem of the content of hydrogen obstructing crystallization, it is preferable to use the low pressure CVD method.

Although an example in which the amorphous silicon film is directly formed on the surface of the glass substrate is shown in this embodiment, such a structure may be adopted that a silicon oxide film, a silicon nitride film, a silicon nitride oxide film, or the like is formed as an under layer for the amorphous silicon film.

After the amorphous silicon film is formed, a nickel acetate solution containing nickel with a concentration of 10 ppm in terms of weight is applied, and further, spin drying using a spin coater is carried out so that a surplus solution is blown off.

In this way, there is obtained a state as indicated by 103 in FIG. 1A in which nickel elements are held on the surface of the amorphous silicon film 102.

As a method of introducing nickel, a method of using a solution as shown in this embodiment is simplest and the producibility is also very high. Moreover, this method is also advantageous in that the amount of introduction of nickel can be easily adjusted by controlling the concentration of nickel.

As other methods of introducing nickel, a CVD method, a sputtering method, an evaporation method, a gas adsorption method, an ion implantation method, or the like may be used.

After the state shown in FIG. 1A is obtained, a heat treatment is carried out in this state to crystallize the amorphous silicon film 102, so that a crystalline silicon film 104 shown in FIG. 1B is obtained This heat treatment is carried out in a nitrogen atmosphere under the condition of 600° C. for 8 hours. This heat treatment may be carried out at a temperature in the range of 450° C. to the distortion point of the glass substrate.

In general, in the case where nickel is not introduced, the amorphous silicon film is not crystallized under the condition of 600° C. 5 and 8 hours.

In the foregoing heat treatment, the nickel elements held on the surface of the amorphous silicon film 102 are diffused into the film.

At that time, crystallization progresses.

It may be said that this step promotes crystallization by diffusing nickel into the film.

The nickel element with a concentration of $1 \times 10^{18}$ atoms/$cm^3$ to $5 \times 10^{18}$ atoms/$cm^3$ exists in the crystalline silicon film 104. The value was obtained by SIMS (Secondary Ion Mass Spectroscopy).

After the crystalline silicon film 104 as shown in FIG. 1B is obtained, an oxide film 105 shown in FIG. 1C is formed.

Here, a heat treatment at 640° C. for 2 hours is carried out in an oxygen atmosphere, so that the thermal oxide film 105 with a thickness of about 10 nm is formed. The thermal oxide film is formed here since the thermal oxide film is densest and subsequently functions as an etching stopper most effectively.

It is preferable that the thickness of the thermal oxide film 105 is not larger than 20 nm. A halogen element typified by chlorine may be added into the atmosphere at the formation of the thermal oxide film.

A silicon oxide film formed by a plasma CVD method or a thermal CVD method, a silicon nitride film formed by a plasma CVD method, a silicon nitride oxide film, or the like may be used other than the thermal oxide film.

Next, an amorphous silicon film 106 doped with a high concentration of phosphorus and having a thickness of 200 nm is formed (FIG. 1C).

It is important that this amorphous silicon film 106 satisfies the following conditions.

(1) The thickness of the amorphous silicon film 106 is larger than the thickness of the silicon film 104, preferably more than two times.

(2) The concentration of phosphorus is higher than the concentration of nickel in the silicon film 104, preferably more than five times.

If the above conditions (1) and (2) are satisfied, in a subsequent heat treatment, nickel elements in the crystalline silicon film 104 can be effectively transferred into the silicon film 106.

In this embodiment, by a plasma CVD method using a film forming gas of a mixture of silane of 98 vol % and phosphine of 2 vol %, the amorphous silicon film 106 containing phosphorus of the order of $10^{20}$ atoms/cm$^3$ is formed.

After the state shown in FIG. 1C is obtained in this way, a heat treatment is again carried out. In this step, the nickel elements in the crystalline silicon film 104 are transferred into the silicon film 106 through the oxide film 105 (FIG. 1D).

Figure 1D:
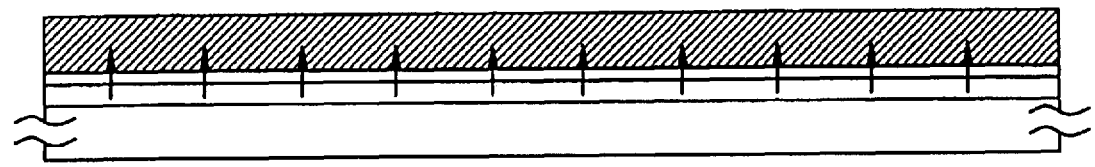

FIG. 1D shows the state with arrows in which the nickel elements are transferred from the silicon film 104 to the silicon film 106.

Phosphorus and nickel have variety of combined states, and the combined states are extremely stable. Thus, the nickel elements transferred from the silicon film 104 to the silicon film 106 are combined with phosphorus in the silicon film 106, and are fixed therein. That is, there is obtained a state in which the nickel elements have transferred from the silicon film 104 to the silicon film 106.

This can be regarded as a state in which the nickel elements have been gettered from the silicon film 104 to the silicon film 106.

Incidentally, in the above step, a care must be paid to the thickness of the oxide film 105 since if the oxide film is thick, the movement of the nickel elements is blocked.

The foregoing heat treatment is carried out in a nitrogen atmosphere under the condition of 600° C. for 4 hours.

This heat treatment can be carried out in the range of 450° C. to 750° C. If a temperature is below this temperature range, the transfer of nickel is not actively carried out. If a temperature is above this temperature range, the transfer of phosphorus in the silicon film 106 becomes tangible so that it is impossible to obtain such a function that nickel is transferred to the silicon film 106 and is fixed therein.

In this step, although the amorphous silicon film 106 is crystallized, this does not especially cause a problem.

In this way, the nickel elements in the silicon film 104 are drawn into the silicon film 106, so that the silicon film 104 in which the concentration of nickel is lowered can be obtained. This silicon film 104 has high crystallinity by the action of nickel, and this film is obtained in such a state that the concentration of nickel in the film is lowered.

Figure 1E:
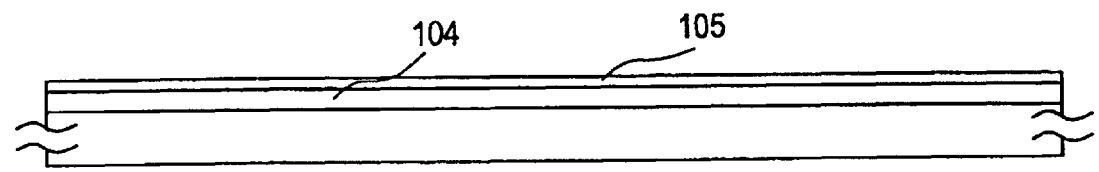

Next, the silicon film 106 is removed by an appropriate etching method so that the state shown in FIG. 1E is obtained. At this time, the oxide film 105 functions as an etching stopper. If the oxide film 105 does not exist, the crystalline silicon film 104 is also etched. In the case of using a gas etching, ClF$_3$ may be uses as an etching gas. Also, in the case of using a wet etching, hydrazine or N$_2$H$_4$—H$_2$O$_2$ solution may be used as an etchant.

Figure 1F:
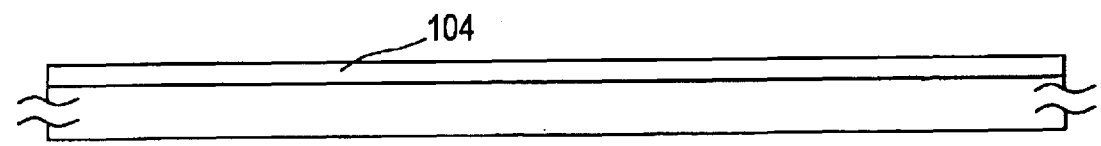

Next, the oxide film 105 is removed so that the crystalline silicon film 104 formed on the glass substrate is obtained (FIG. 1F).

In this embodiment, although the oxide film 105 is removed, the oxide film 105 may use it as a protective film and may be left to use it at subsequent formation of a device.

Embodiment 2

This embodiment shows an example in which a crystalline silicon film is obtained by a manufacturing method different from embodiment 1.

Figure 2A:
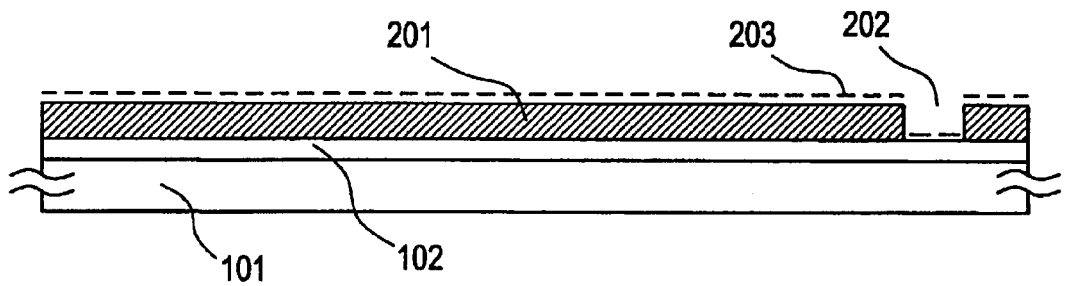
FIGS. 2A to 2F are views showing steps of obtaining a crystalline silicon film.

FIGS. 2A to 2F show the manufacturing steps of this embodiment. First, as shown in FIG. 2A, an amorphous silicon film 102 with a thickness of 50 nm is formed on a Corning 1737 glass substrate 101 by the low pressure CVD method.

In the case where a mode of crystal growth shown in this embodiment is carried out, it is preferable to use the low pressure CVD method as a method of forming the amorphous silicon film as a starting film.

After the amorphous silicon film 102 is formed, a not-shown silicon oxide film with a thickness of 200 nm is formed. By patterning the not-shown silicon oxide film, a mask 201 is formed. This mask 201 is provided with an opening 202.

This opening 202 is shaped into a slit having a longitudinal direction from this side of the drawing to the depth side.

Next, a nickel acetate solution with a nickel concentration of 10 ppm in terms of weight is applied. Then a surplus nickel solution is blown off by using a spin coater.

In this way, there is obtained a state as indicated by 203 in which nickel elements are held on the surface.

In this state, there is obtained a state in which the nickel elements are selectively held on the surface of the amorphous silicon film 102 in the region where the opening 202 is provided. That is, there is obtained a state in which the nickel elements are held on a part of the surface of the amorphous silicon film 102 in a slit shape.

In this way, the state shown in FIG. 2A is obtained. Next, a heat treatment at 560° C. for 14 hours is carried out in a nitrogen atmosphere.

Figure 2B:
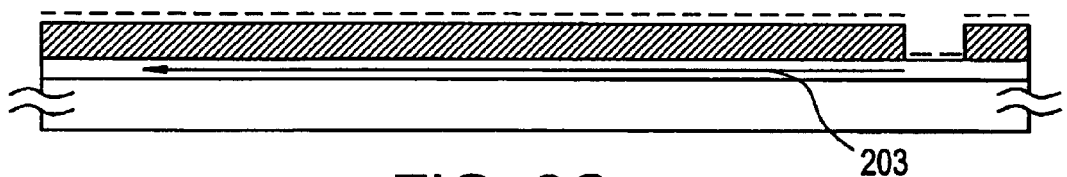

In this step, the nickel elements are diffused into the amorphous silicon film 102 from the region where the opening 202 is provided, and in accordance with the diffusion, crystallization progresses toward the direction indicated by an arrow 203 in FIG. 2B.

This crystallization is carried out in the direction approximately parallel to the film surface and in the direction vertical to an extending direction of the opening 202. This crystal growth will be referred to as lateral growth. This crystal growth (lateral growth) can extend over 100 μm.

It is preferable to carry out this heat treatment for the crystal growth under the heating condition of a temperature of 570° C. or lower. This is because if a temperature is above this heating condition, the lateral growth is blocked by the influence of natural crystallization (crystal growth in a minute region independent of the action of nickel).

However, if the temperature of the heat treatment is lowered, the growth rate of the lateral growth itself also becomes slow, so that there occurs a problem that a processing time becomes long.

After the crystal growth shown in FIG. 2B is ended, the mask 201 made of the silicon oxide film is removed.

Figure 2C:
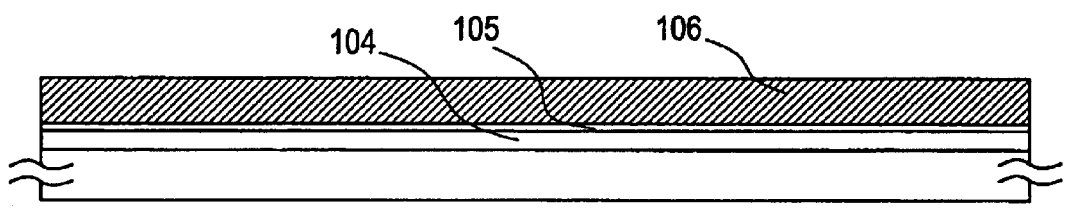

Then a thermal oxide film 105 is formed as shown in FIG. 2C. The film growth condition is the same as embodiment 1. Further, under the same condition as embodiment 1, an amorphous silicon film 106 containing a high concentration of phosphorus is formed.

Figure 2D:
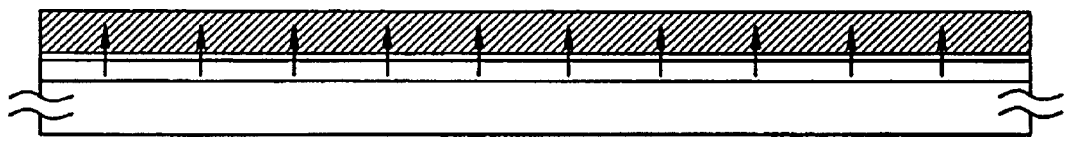

Thereafter, in accordance with the method shown in embodiment 1, as shown in FIG. 2D, the nickel elements in the silicon film 104 are transferred into the silicon film 106.

Figure 2E:
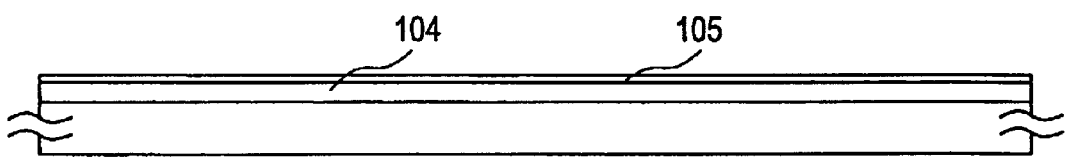
Figure 2F:
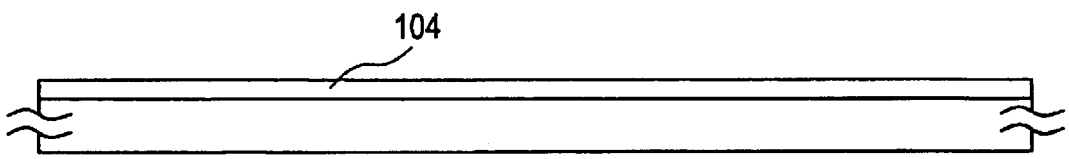

Further, the silicon film 106 is removed as shown in FIG. 2E, and besides, the thermal oxide film 105 is removed.

In this way, when nickel elements are used, there is obtained a crystalline silicon film which has a peculiar crystal growth mode, called the lateral growth, and in which the nickel elements in the film are lowered.

Embodiment 3

In this embodiment, a TFT is manufactured by using a crystalline silicon film obtained through the manufacturing method shown in embodiment 1 or embodiment 2.

First, a crystalline silicon film is obtained in accordance with the manufacturing steps of embodiment 1 or embodiment 2. Next, this crystalline silicon film is patterned to obtain a pattern 307 in FIG. 3A.

Then a silicon oxide film 308, which becomes a gate insulating film, with a thickness of 120 nm is formed by a plasma CVD method.

Next, a not-shown aluminum film with a thickness of 400 nm for constituting a gate electrode is formed by a sputtering method. This aluminum film is formed by using a target containing scandium of 0.18 wt %.

Scandium is made to be contained in the aluminum film in order to suppress the formation of spike-like or needle-like protrusions called hillocks or whiskers, which are caused by abnormal growth of aluminum in a subsequent step.

Figure 3A:
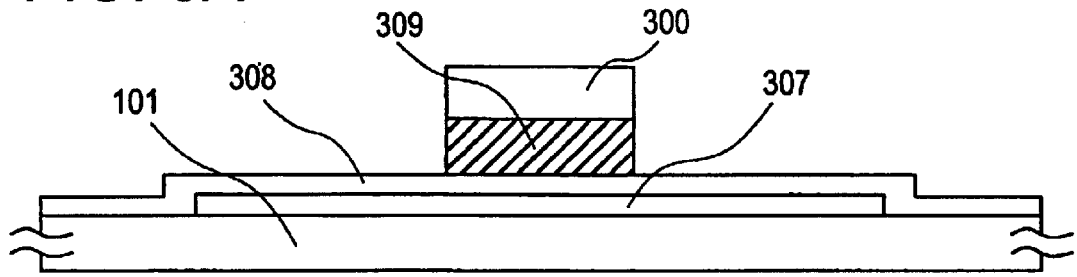
FIGS. 3A to 3E are views showing manufacturing steps of a TFT.

Next, the not-shown aluminum film is patterned by using a resist mask 300 to form a pattern 309 shown in FIG. 3A.

Next, anodic oxidation using the aluminum pattern 309 as an anode is carried out in the state where the resist mask 300 remains.

Figure 3B:
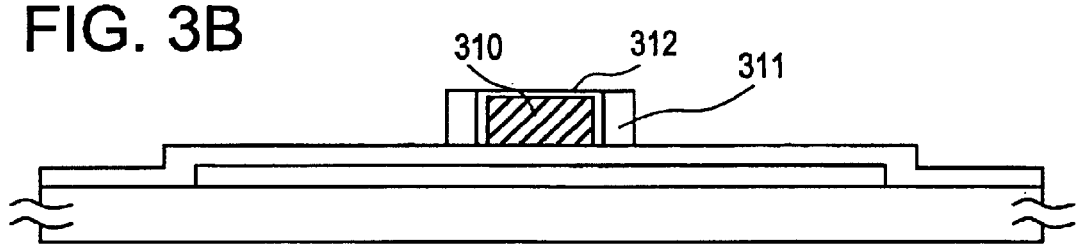

In this step, a solution containing oxalic acid of 3% (volume) is used as an electrolyte, the aluminum pattern is used as an anode, platinum is used as a cathode, and current is flown between both electrodes. In this way, an anodic oxidation film 311 is formed (FIG. 3B).

Since this step is carried out in the state in which the resist mask 300 remains, the anodic oxidation film is formed as indicated by 311 on the side of the aluminum pattern 309. What is indicated by 310 is a remaining aluminum film pattern.

In this embodiment, the growth distance of the anodic oxidation film 311 is made 400 nm. The anodic oxidation film 311 formed in this embodiment is porous.

After the anodic oxidation film 311 is formed, the resist mask 300 is removed. Then anodic oxidation is carried out again. In this step, an ethylene glycol solution containing tartaric acid of 3 (volume) % and neutralized with ammonia water is used as an electrolyte.

In this step, since the electrolyte penetrates into the inside of the porous anodic oxidation film 311, an anodic oxidation film as indicated by 312 is formed.

That is, the anodic oxidation film 312 is formed on the surface of the aluminum pattern 310. The aluminum pattern 310 subsequently becomes a gate electrode.

The thickness of the anodic oxidation film 312 is made 70 nm. This anodic oxidation film has a dense film quality.

In this way, the state shown in FIG. 3B is obtained.

Next, the exposed portion of the silicon oxide film 308 is removed by using the gate electrode 310, the anodic oxidation film 312 with a dense film quality around the gate electrode, and the porous anodic oxidation film 311 as masks.

Figure 3C:
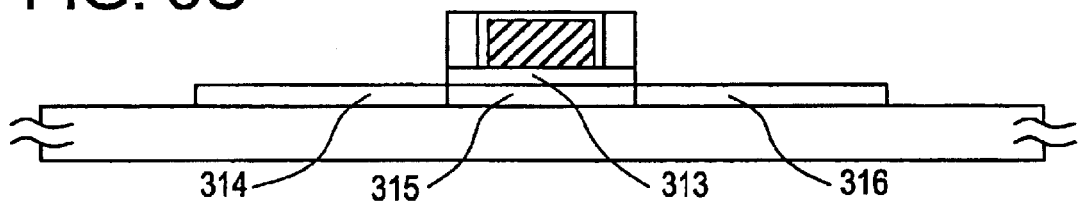

Here, the exposed silicon oxide film 308 is removed by etching using a dry etching method (RIE method) with vertical anisotropy. In this way, the state shown in FIG. 3C is obtained. Here, the silicon oxide film (gate insulating film) indicated by 313 remains.

Next, doping of phosphorus is carried out by a plasma doping method. The plasma doping method is such a doping method that a raw material gas containing a dopant is made plasma, a dopant ion is drawn therefrom, the ion is accelerated by an electric field, and the accelerated ion is implanted into a region to be doped. In general, the plasma doping method is a method in which mass separation using a magnetic field is not carried out.

On the other hand, a method often used in manufacture of an IC or the like, in which mass separation is carried out and a separated dopant ion is accelerated and implanted, is called an ion implantation method.

Although the plasma doping method has superiority of being able to deal with a large area, it has a problem that doping of other elements, such as hydrogen, contained in a dopant gas is also carried out.

Doping of phosphorus is carried out in regions 314 and 316 by this doping. This doped regions will be referred to as high concentration impurity regions for convenience. Incidentally, the regions 314 and 316 subsequently become a source and a drain.

It is sufficient if this doping is carried out under a normal doping condition for forming source and drain regions.

A region 315 remains as a region where the doping was not carried out.

Figure 3D:
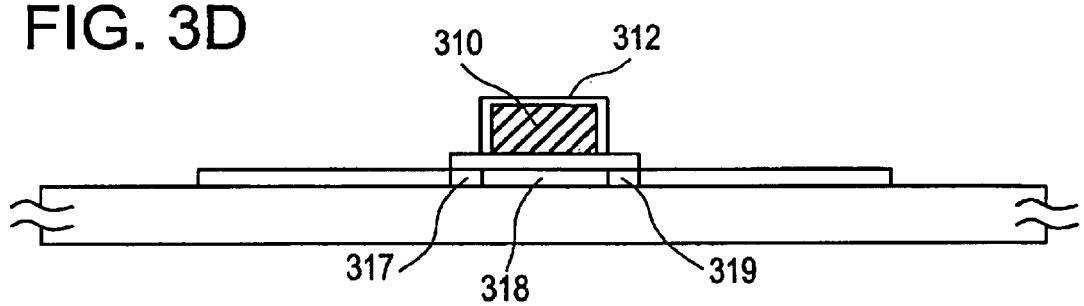

Next, the porous anodic oxidation film 311 is removed to obtain the state as shown in FIG. 3D. Doping of phosphorus is carried out again by a plasma doping method. This step is carried out at a dose lower than the doping in the step shown in FIG. 3C.

In this way, low concentration impurity regions 317 and 319 where doping was carried out at a dose lower than the source and drain regions, are formed. A region 318 where doping was not carried out is defined as a channel region (FIG. 3D).

Next, the irradiation of excimer laser light is carried out to activate the doped regions. Concretely, damages of the doped regions caused at doping are annealed, and the dopants in the doped regions are activated.

Although a high resistance region is formed adjacently to the channel region 318 by the thickness of the anodic oxidation film 312 having a dense film quality, since the thickness of the anodic oxidation film 312 is as thin as 70 nm, the existence thereof will be neglected.

Next, as shown in FIG. 2E, a silicon nitride film 322 with a thickness of 250 nm is formed as an interlayer insulating film by a plasma CVD method. Moreover, an acrylic resin film 323 is formed by using a spin coating method. The thickness of the acrylic resin film 323 is made 700 nm at the minimum portion.

Figure 3E:
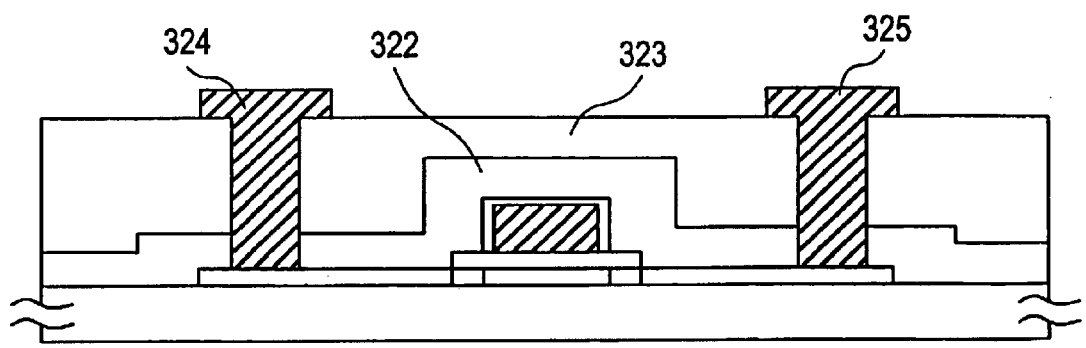

Further, contact holes are formed, and a source electrode 324 and a drain electrode 325 are formed. In this way, a TFT (thin film transistor) shown in FIG. 3E is completed.

In this way, an active layer having crystallinity higher than the prior art can be formed on a glass substrate, and a TFT having high characteristics can be obtained.

Embodiment 4

This embodiment shows, in the manufacturing steps shown in embodiment 1 or embodiment 2, an example of a step of activating the silicon film 106 for carrying out gettering of nickel.

First, the case of embodiment 1 will be described. In this case, in the state shown in FIG. 1C, the amorphous silicon film 106 is irradiated with a KrF excimer laser beam shaped into a linear beam.

By this, phosphorus in the amorphous silicon film 106 is activated and a gettering effect in a subsequent gettering step can be improved.

Here, although an example of laser beam irradiation is shown, this annealing may be carried out by irradiation of infrared rays.

In the case of embodiment 2, laser beam irradiation is carried out in the state shown in FIG. 2C. Alternatively, irradiation of infrared rays may be carried out.

Embodiment 5

In this embodiment, an example of a case where a bottom gate type TFT is manufactured, will be described. FIGS. 4A to 4D show the manufacturing steps of this embodiment.

Figure 4A:
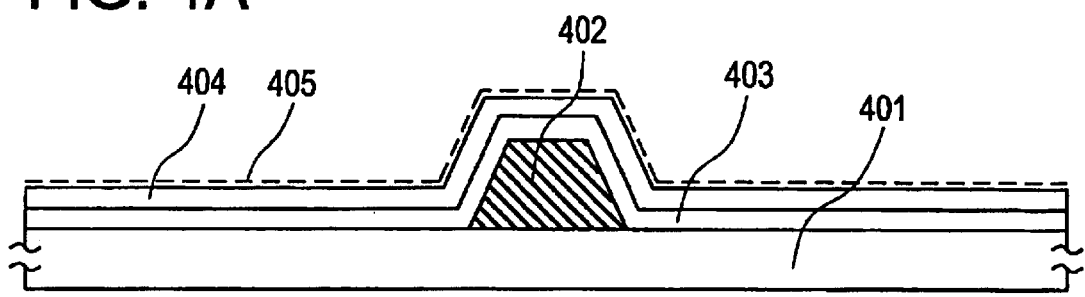
FIGS. 4A to 4D are views showing manufacturing steps of a TFT.

First, a gate electrode 402 is formed on a glass substrate 401. In this embodiment, an example in which an under layer is not formed on the glass substrate will be shown (FIG. 4A).

It is necessary to select a material for the gate electrode 402, which can withstand a subsequent heat treatment step. Here, a tantalum film with a thickness of 400 nm formed by a sputtering method is used for the gate electrode 402 (FIG. 4A).

After the gate electrode 402 is formed, a silicon oxide film 403 with a thickness of 100 nm, which becomes a gate insulating film, is formed by a plasma CVD method.

Next, an amorphous silicon film 404 with a thickness of 50 nm is formed by a plasma CVD method. As a method of forming the amorphous silicon film, a low pressure CVD method may be used instead of the plasma CVD method.

Next, a nickel acetate solution is applied to the exposed entire surface of the amorphous silicon film to obtain a state as indicated by 405 in which nickel elements are held on the surface (FIG. 4A).

Here, although an example in which the nickel elements are introduced into the entire surface of the amorphous silicon film is shown, such a structure may be adopted that a mask is provided to selectively introduce nickel to carry out lateral growth.

Figure 4B:
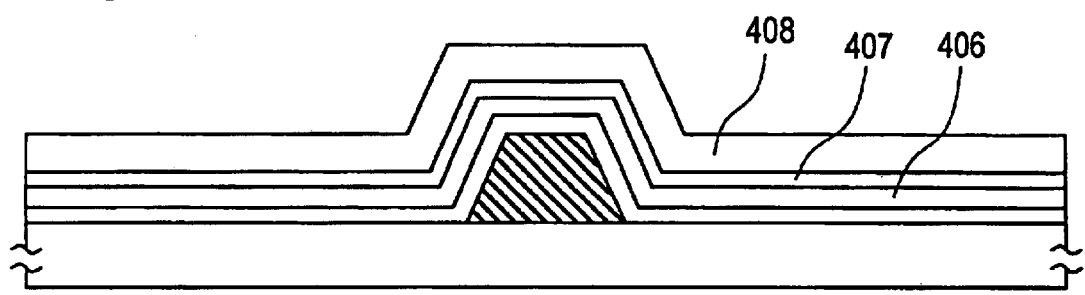

Next, a heat treatment at 600° C. for 8 hours is carried out to crystallize the amorphous silicon film 404, so that a crystalline silicon film 406 is obtained (FIG. 4B).

Next, a thermal oxide film 407 made of a silicon oxide film having a thickness of 10 nm is formed. Further, an amorphous silicon film 408 with a thickness of 200 nm, which is doped with a high concentration of phosphorus, is formed by a plasma CVD method.

Here, the amorphous silicon film 408 is formed by a plasma CVD method using a film forming gas of a mixture of silane of 99 vol % and phosphine of 1 vol %.

Next, a heat treatment at 600° C. for 2 hours is carried out so that nickel elements in the crystalline silicon film 406 are transferred into the amorphous silicon film 408. That is, the nickel elements in the crystalline silicon film 406 are gettered into the amorphous silicon film 408.

Figure 4C:
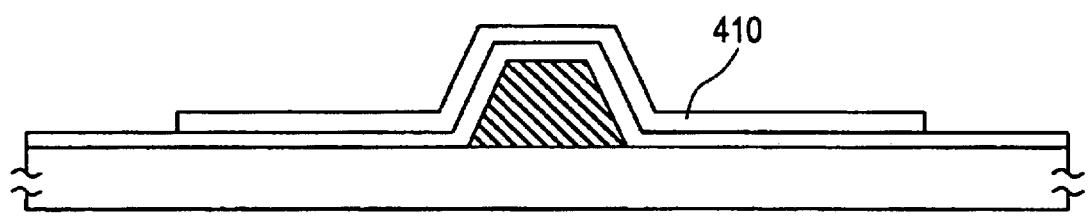

Next, the amorphous silicon film 408 and the thermal oxide film 407 are removed. Then the crystalline silicon film 406 is patterned to obtain a pattern 410. The pattern 410 of the crystalline silicon film becomes an active layer of a TFT (FIG. 4C).

Then a not-shown mask for doping is provided so that selective doping of phosphorus is carried out for the active layer.

In this step, regions 411 and 413 are doped with phosphorus.

In this embodiment, although there is shown an example in which an N-channel TFT is manufactured, when a P-channel TFT is manufactured, it is sufficient if doping of boron is carried out.

After the doping is ended, laser annealing is carried out to activate the doped region.

Figure 4D:
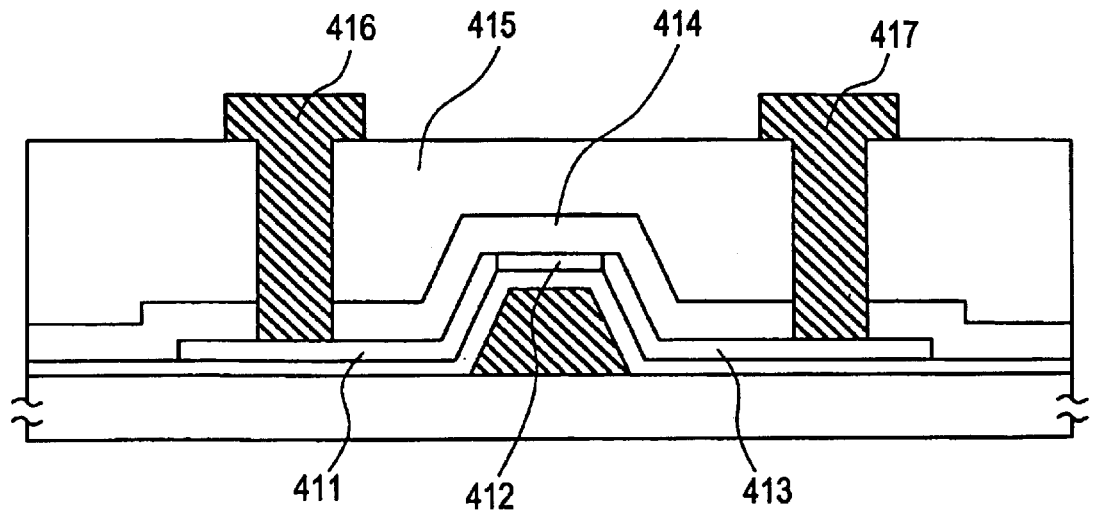

In this way, a source region 411, a channel region 412, and a drain region 413 are formed (FIG. 4D).

Next, a silicon nitride film 414 with a thickness of 300 nm is formed as an interlayer insulating film by a plasma CVD method. Further, an acrylic resin film 415 is formed by a spin coating method.

A resin material such as polyimide, polyamide, polyimide amide, and epoxy may be used other than the acrylic resin film.

After the interlayer insulating film is formed, contact holes are formed, and a source electrode 416 and a drain electrode 417 are formed. In this way, a bottom gate type TFT shown in FIG. 4D is completed.

Embodiment 6

Figure 5:
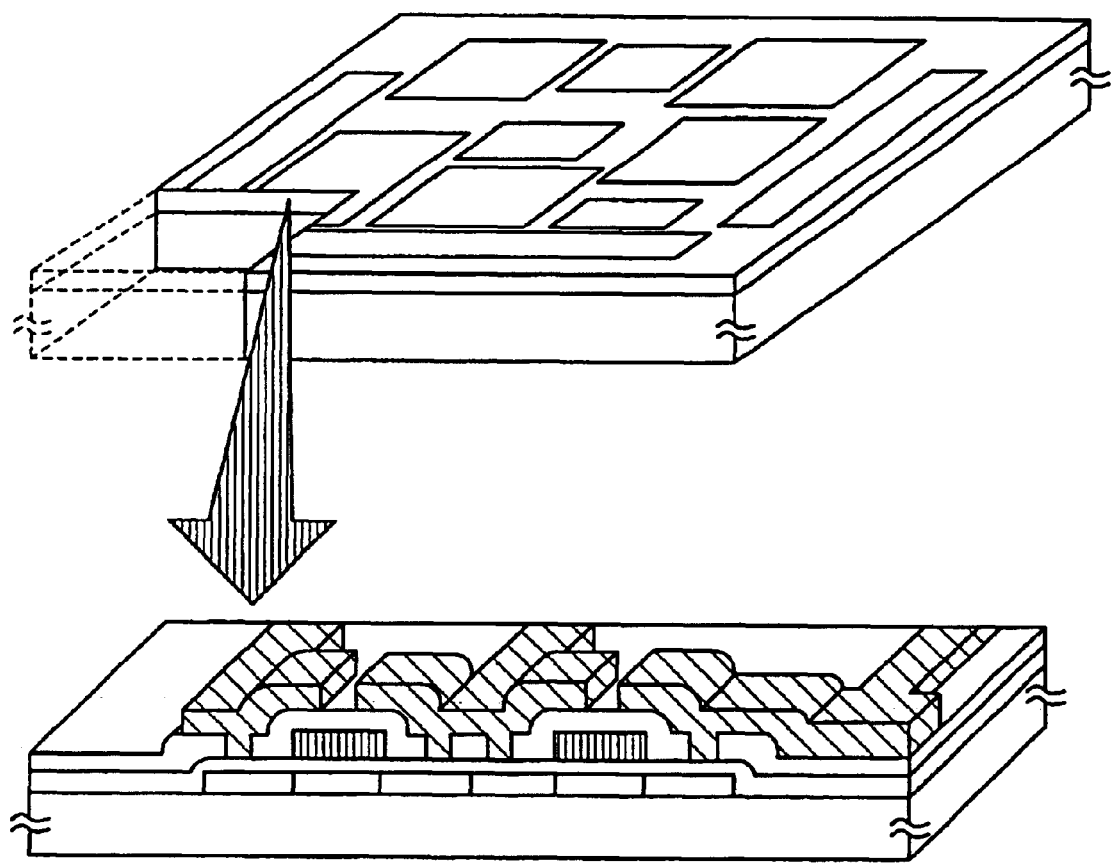
FIG. 5 is a schematic view showing an integrated circuit using TFTs.

In this embodiment, examples of integrated circuits using TFTs will be shown. As examples of integrated circuits, a CPU, a memory, various kinds of arithmetic circuits, an amplifying circuit, a switch circuit, and the like are enumerated. FIG. 5 shows an outline of an integrated circuit using TFTs and a section of a part thereof.

Embodiment 7

The thin film transistor disclosed in the present specification can be used for various kinds of flat panel displays, an information processing terminal equipped with a flat panel display, a video camera, and the like. In the present specification, these devices will be generically referred to as a semiconductor device.

Examples of concrete structures of various semiconductor devices will be described below. FIGS. 6A to 6F show examples of various kinds of semiconductor devices. Each of these semiconductor devices uses a TFT for at least a part thereof.

Figure 6A:
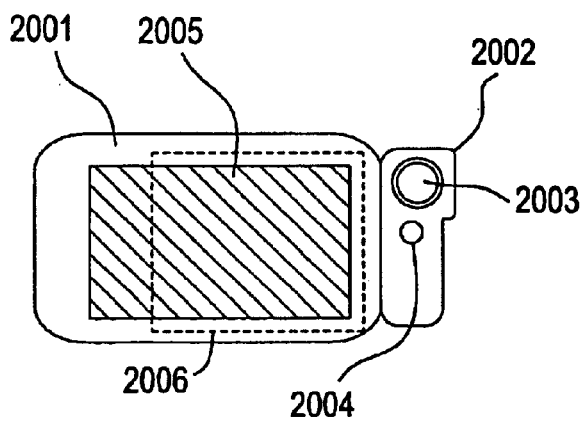
FIGS. 6A to 6F are views showing the outline of a device using TFTs.

FIG. 6A shows a portable information processing terminal. This information processing terminal includes a main body 2001 equipped with an active matrix type liquid crystal display or an active matrix type EL display 2005 and a camera portion 2002 for taking in information from the outside. Moreover, an integrated circuit 2006 is provided in the inside.

An image receiving portion 2003 and an operation switch 2004 are disposed in the camera portion 2002.

It is expected that in future, the information processing terminal becomes increasingly thin and light to improve the portability.

In such a structure, it is preferable to integrate a peripheral driving circuit, an arithmetic circuit, and a memory circuit by TFTs on a substrate where the active matrix type display 2005 is formed.

Figure 6B:
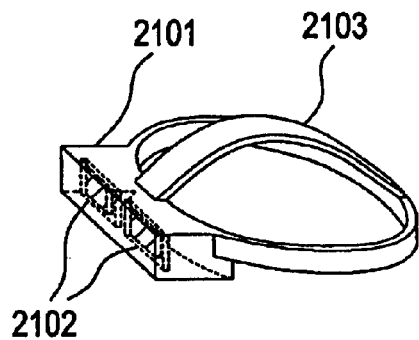

FIG. 6B shows a head mount display. This device includes a main body 2101 equipped with an active matrix type liquid crystal display or an EL display 2102. The main body 2101 can be mounted on a head by a band 2103.

Figure 6C:
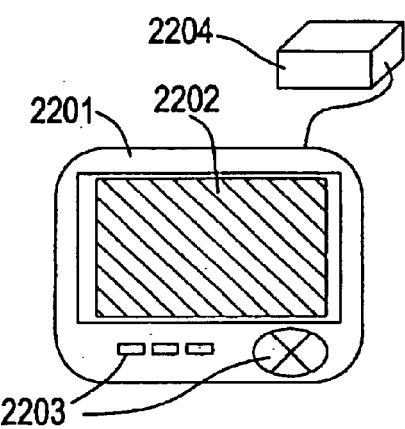

FIG. 6C shows a car navigation system having such a function that an antenna 2204 receives a signal from an artificial satellite, and on the basis of the signal, geographical information is displayed on an active matrix type liquid crystal display 2202 disposed in a main body 2201.

An EL type display device may be adopted for the display 2202. In both cases, the display is an active matrix type flat panel display using TFTs.

An operation switch 2203 is disposed in the main body 2201 so that various operations can be made.

Figure 6D:
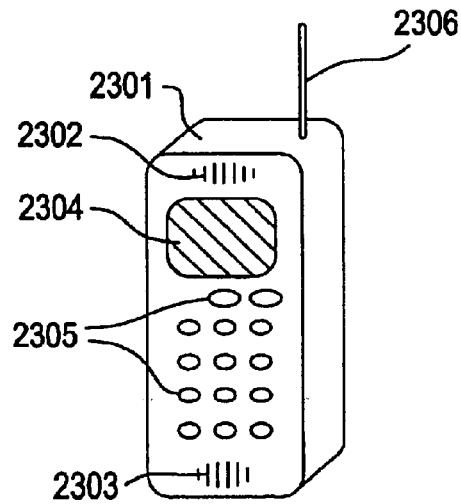

FIG. 6D shows a portable telephone. This device includes a main body 2301 equipped with an active matrix type liquid crystal display device 2304, an operation switch 2305, an audio input portion 2303, an audio output portion 2302, and an antenna 2306.

In recent years, a structure such as a combination of a portable information processing terminal as shown in FIG. 6A and a portable telephone as shown in FIG. 6D has been produced on a commercial basis.

Figure 6E:
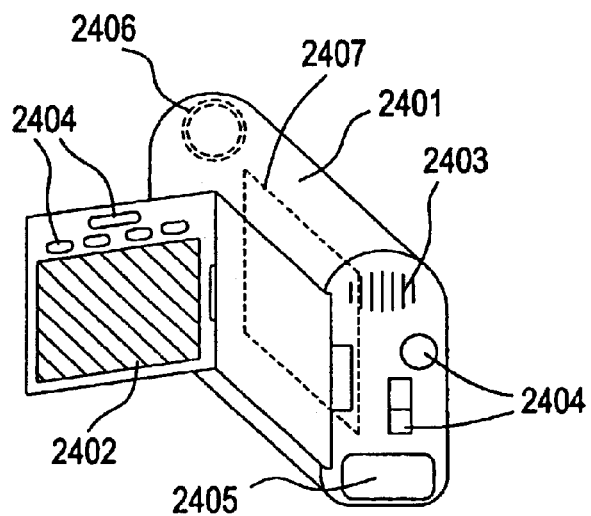

FIG. 6E shows a portable video camera. This device includes a main body 2401 equipped with an image receiving portion 2406, an audio input portion 2403, an operation switch 2404, an active matrix type liquid crystal display 2402, and a battery 2405. In addition, an integrated circuit 2407 is provided.

Figure 6F:
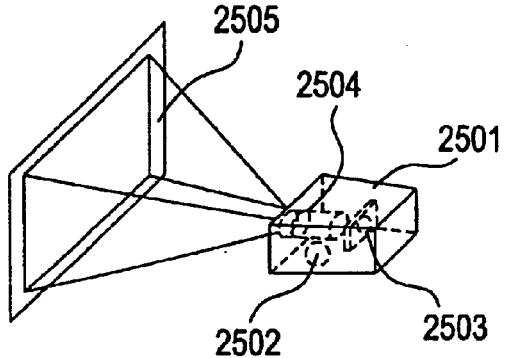

FIG. 6F shows a front projection type liquid crystal display device. This device has such a function that light from a light source 2502 disposed in a main body 2501 is optically modulated by a refection type liquid crystal display device 2503, and is enlarged by an optical system 2504 so that an image is projected onto a screen 2505.

In this example, a reflection type is used for the liquid crystal display device 2503. However, a transmission type liquid crystal display device may be used. In this case, it is sufficient if an optical system is changed.

In these examples, liquid crystal display devices have been mainly shown. However, an EL display device may be adopted as an active matrix type display device.

Embodiment 8

In this embodiment, in the structure of the foregoing embodiments, a film of $Si_xGe_{1-x}$ (0<x<1) is used for the silicon film.

For example, in the case of embodiment 1, the amorphous silicon film 102 may be changed into a film of $Si_xGe_{1-x}$ (0<x<1). Moreover, the film 106 doped with phosphorus may be changed into a film of $Si_xGe_{1-x}$ (0<x<1).

By using the present invention disclosed in the present specification, in the technique of obtaining a crystalline silicon film in which a metallic element for promoting crystallization of silicon is used, it is possible to provide a structure in which the influence of a nickel element remaining in the obtained silicon film can be removed.

What is claimed is:

1. A method for manufacturing a semiconductor device comprising the steps of:

forming a first semiconductor film over a substrate;

providing a crystallization promoting material with the first semiconductor film;

crystallizing the first semiconductor film;

forming a barrier film on the first semiconductor film;

forming a second semiconductor film comprising silicon and an element which facilitates absorption of the crystallization promoting material on the barrier film;

heating the crystallized first semiconductor film so that the crystallization promoting material contained in the crystallized first semiconductor film is transferred to the second semiconductor film through the barrier film; and removing the second semiconductor film after the heating step, wherein a thickness of the second semiconductor film is larger than that of the first semiconductor film, and wherein the element which facilitates absorption of the crystallization promoting material is an element different from silicon.

2. A method according to claim 1, wherein the silicon is amorphous.

3. A method according to claim 1, wherein the barrier film comprises a material selected from the group consisting of silicon oxide, silicon nitride and silicon nitride oxide.

4. A method according to claim 1, wherein the crystallization promoting material is selected from the group consisting of Fe, Go, Ni, Ru, Rh, Pd, Os, Ir, Pt, Cu, Au, Ge, Pb, In and a combination thereof.

5. A method according to claim 1, wherein the first semiconductor film comprises $Si_xGe_{1-x}$ (0<x<1).

6. A method according to claim 1, wherein the semiconductor device is incorporated into an electronic apparatus selected from the group consisting of a portable information processing terminal, a head mount display, a car navigation system, a portable phone, a portable video camera, a front type liquid crystal display device, a reflection type liquid crystal display device and an EL display device.

7. A method for manufacturing a semiconductor device comprising the steps of:

forming a first semiconductor film over a substrate;

providing a crystallization promoting material with the first semiconductor film;

crystallizing the first semiconductor film;

forming a barrier film on the first semiconductor film;

forming a second semiconductor film comprising silicon and an element which facilitates absorption of the crystallization promoting material on the barrier film;

heating the crystallized first semiconductor film at a temperature of 450 to 750° C. so that the crystallization promoting material contained in the crystallized first semiconductor film is transferred to the second semiconductor film through the barrier film; and removing the second semiconductor film after the heating step, wherein a thickness of the second semiconductor film is larger than that of the first semiconductor film, and wherein the element which facilitates absorption of the crystallization promoting material is an element different from silicon.

8. A method according to claim 7, wherein the silicon is amorphous.

9. A method according to claim 7, wherein the barrier film comprises a material selected from the group consisting of silicon oxide, silicon nitride and silicon nitride oxide.

10. A method according to claim 7, wherein the crystallization promoting material is selected from the group consisting of Fe, Go, Ni, Ru, Rh, Pd, Os, Ir, Pt, Cu, Au, Ge, Pb, In and a combination thereof.

11. A method according to claim 7, wherein the first semiconductor film comprises $Si_xGe_{1-x}(0<x<1)$.

12. A method according to claim 7, wherein the semiconductor device is incorporated into an electronic apparatus selected from the group consisting of a portable information processing terminal, a head mount display, a car navigation system, a portable phone, a portable video camera, a front type liquid crystal display device, a reflection type liquid crystal display device and an EL display device.

13. A method for manufacturing a semiconductor device comprising the steps of:

forming a first semiconductor film over a substrate;

providing a crystallization promoting material with the first semiconductor film;

crystallizing the first semiconductor film;

forming a barrier film on the first semiconductor film;

forming a second semiconductor film comprising silicon and an element which facilitates absorption of the crystallization promoting material on the barrier film;

heating the crystallized first semiconductor film so that the crystallization promoting material contained in the crystallized first semiconductor film is transferred to the second semiconductor film through the barrier film; and removing the second semiconductor film after the heating step, wherein a thickness of the barrier film is 20 nm or less, wherein a thickness of the second semiconductor film is larger than that of the first semiconductor film, and wherein the element which facilitates absorption of the crystallization promoting material is an element different from silicon.

14. A method according to claim 13, wherein the silicon is amorphous.

15. A method according to claim 13, wherein the barrier film comprises a material selected from the group consisting of silicon oxide, silicon nitride and silicon nitride oxide.

16. A method according to claim 13, wherein the crystallization promoting material is selected from the group consisting of Fe, Co, Ni, Ru, Rh, Pd, Os, Ir, Pt, Cu, Au, Ge, Pb, In and a combination thereof.

17. A method according to claim 13, wherein the first semiconductor film comprises $Si_xGe_{1-x}(0<x<1)$.

18. A method according to claim 13, wherein the semiconductor device is incorporated into an electronic apparatus selected from the group consisting of a portable information processing terminal, a head mount display, a car navigation system, a portable phone, a portable video camera, a front type liquid crystal display device, a reflection type liquid crystal display device and an EL display device.

19. A method for manufacturing a semiconductor device comprising the steps of:

forming a first semiconductor film over a substrate;

providing a crystallization promoting material with the first semiconductor film;

crystallizing the first semiconductor film;

forming a barrier film on the first semiconductor film;

forming a second semiconductor film comprising silicon and an element which facilitates absorption of the crystallization promoting material on the barrier film;

heating the crystallized first semiconductor film so that the crystallization promoting material contained in the crystallized first semiconductor film is transferred to the second semiconductor film through the barrier film;

removing the second semiconductor film after the heating step;

forming a gate insulating film on the second semiconductor film; and forming a gate electrode on the gate insulating film, wherein a thickness of the second semiconductor film is larger than that of the first semiconductor film, and wherein the element which facilitates absorption of the crystallization promoting material is an element different from silicon.

20. A method according to claim 19, wherein the silicon is amorphous.

21. A method according to claim 19, wherein the barrier film comprises a material selected from the group consisting of silicon oxide, silicon nitride and silicon nitride oxide.

22. A method according to claim 19, wherein the crystallization promoting material is selected from the group consisting of Fe, Co, Ni, Ru, Rh, Pd, Os, Ir, Pt, Cu, Au, Ge, Pb, In and a combination thereof.

23. A method according to claim 19, wherein the first semiconductor film comprises $Si_xGe_{1-x}(0<x<1)$.

24. A method according to claim 19, wherein the semiconductor device is incorporated into an electronic apparatus selected from the group consisting of a portable information processing terminal, a head mount display, a car navigation system, a portable phone, a portable video camera, a front type liquid crystal display device, a reflection type liquid crystal display device and an EL display device.

25. A method for manufacturing a semiconductor device comprising the steps of:

forming a gate electrode over a substrate;

forming a gate insulating film on the gate electrode;

forming a first semiconductor film on the gate insulating film;

providing a crystallization promoting material with the first semiconductor film;

crystallizing the first semiconductor film;

forming a barrier film on the first semiconductor film;

forming a second semiconductor film comprising silicon and an element which facilitates absorption of the crystallization promoting material on the barrier film;

heating the crystallized first semiconductor film so that the crystallization promoting material contained in the crystallized first semiconductor film is transferred to the second semiconductor film through the barrier film; and removing the second semiconductor film after the heating step, wherein a thickness of the second semiconductor film is larger than that of the first semiconductor film, and wherein the element which facilitates absorption of the crystallization promoting material is an element different from silicon.

26. A method according to claim 25, wherein the silicon is amorphous.

27. A method according to claim 25, wherein the barrier film comprises a material selected from the group consisting of silicon oxide, silicon nitride and silicon nitride oxide.

28. A method according to claim 25, wherein the crystallization promoting material is selected from the group consisting of Fe, Co, Ni, Ru, Rh, Pd, Os, Ir, Pt, Cu, Au, Ge, Pb, In and a combination thereof.

29. A method according to claim 25, wherein the first semiconductor film comprises $Si_xGe_{1-x}(0<x<1)$.

30. A method according to claim 25, wherein the semiconductor device is incorporated into an electronic apparatus selected from the group consisting of a portable information processing terminal, a head mount display, a car navigation system, a portable phone, a portable video camera, a front type liquid crystal display device, a reflection type liquid crystal display device and an EL display device.

31. A method for manufacturing a semiconductor device comprising the steps of:

forming a first semiconductor film over a substrate;

providing a crystallization promoting material with the first semiconductor film;

crystallizing the first semiconductor film;

forming a barrier film by oxidizing a surface of the first semiconductor film;

forming a second semiconductor film comprising silicon and an element which facilitates absorption of the crystallization promoting material on the barrier film;

heating the crystallized first semiconductor film so that the crystallization promoting material contained in the crystallized first semiconductor film is transferred to the second semiconductor film through the barrier film; and removing the second semiconductor film after the heating step, wherein a thickness of the second semiconductor film is larger than that of the first semiconductor film, and wherein the element which facilitates absorption of the crystallization promoting material is an element different from silicon.

32. A method according to claim 31, wherein the silicon is amorphous.

33. A method according to claim 31, wherein the crystallization promoting material is selected from the group consisting of Fe, Co, Ni, Ru, Rh, Pd, Os, Ir, Pt, Cu, Au, Ge, Pb, In and a combination thereof.

34. A method according to claim 31, wherein the first semiconductor film comprises $Si_xGe_{1-x}(0<x<1)$.

35. A method according to claim 31, wherein the semiconductor device is incorporated into an electronic apparatus selected from the group consisting of a portable information processing terminal, a head mount display, a car navigation system, a portable phone, a portable video camera, a front type liquid crystal display device, a reflection type liquid crystal display device and an EL display device.

* * * * *